(12) United States Patent
Flaceau et al.

(10) Patent No.: US 9,867,281 B2
(45) Date of Patent: Jan. 9, 2018

(54) ASSEMBLY COMPRISING A HYPERFREQUENCY COMPONENT AND A PRINTED CIRCUIT

(71) Applicant: RADIALL, Aubervilliers (FR)

(72) Inventors: Alexandre Flaceau, Lyons (FR); Emilie Fond, Tullins (FR)

(73) Assignee: RADIALL, Aubervilliers (FR)

(*) Notice: Subject to any disclaimer, the term of this patent is extended or adjusted under 35 U.S.C. 154(b) by 25 days.

(21) Appl. No.: 14/718,149

(22) Filed: May 21, 2015

(65) Prior Publication Data
US 2015/0342032 A1 Nov. 26, 2015

(30) Foreign Application Priority Data
May 23, 2014 (FR) .................................... 14 54676

(51) Int. Cl.
H05K 7/00 (2006.01)
H05K 1/02 (2006.01)
H05K 1/11 (2006.01)
H01H 50/04 (2006.01)
H01P 5/02 (2006.01)
H05K 1/18 (2006.01)

(52) U.S. Cl.
CPC ........... H05K 1/0243 (2013.01); H01H 50/04 (2013.01); H01P 5/028 (2013.01); H05K 1/0242 (2013.01); H05K 1/115 (2013.01); H05K 1/0221 (2013.01); H05K 1/181 (2013.01); H05K 2201/10053 (2013.01); H05K 2201/10969 (2013.01)

(58) Field of Classification Search
CPC ............... H05K 1/0243; H05K 1/0242; H05K 2201/10053; H05K 1/0251; H05K 1/0237; H05K 1/181; H05K 1/115; H01R 13/6588; H01H 2001/5888
USPC ........... 174/50.56, 50.61, 266; 361/760, 800, 361/816, 820, 818; 36/50.56, 50.61, 266
See application file for complete search history.

(56) References Cited

U.S. PATENT DOCUMENTS

| 4,737,746 A * | 4/1988 | Ueno ..................... H01P 1/2056 333/202 |
| 5,327,326 A * | 7/1994 | Komoto ............... H01R 23/688 361/760 |
| 6,204,738 B1 * | 3/2001 | Toda ..................... H01P 1/2136 333/134 |
| 6,433,276 B1 * | 8/2002 | Bellora ................. H01L 23/045 174/152 GM |

(Continued)

OTHER PUBLICATIONS

French Search Report, dated Jan. 8, 2015, from corresponding French application.

Primary Examiner — Steven T Sawyer
(74) Attorney, Agent, or Firm — Young & Thompson (57) ABSTRACT

The inventive assembly comprises a hyperfrequency component of the surface-mounted component type including at least one first hyperfrequency transmission line, as well as a printed circuit board including at least one second hyperfrequency transmission line able to be put in contact with the first hyperfrequency transmission line. The component comprises an enclosure with a face in contact with the printed circuit board, which includes at least one cavity for confining a hyperfrequency signal, delimited by conductive surfaces of the enclosure, and by a conductive zone of the second hyperfrequency transmission line.

14 Claims, 13 Drawing Sheets

(56) References Cited

U.S. PATENT DOCUMENTS

| | | | |
|---|---|---|---|
| 6,809,255 B1 | 10/2004 | Chun | |
| 7,178,230 B2* | 2/2007 | Tsai | H01R 13/659 |
| | | | 29/592.1 |
| 7,405,477 B1 | 7/2008 | Tao et al. | |
| 2009/0146761 A1* | 6/2009 | Nummerdor | H01P 1/2056 |
| | | | 333/202 |
| 2011/0108320 A1* | 5/2011 | Lakner | G11B 33/123 |
| | | | 174/650 |
| 2012/0326805 A1* | 12/2012 | Nummerdor | H01P 1/2056 |
| | | | 333/185 |

* cited by examiner

ASSEMBLY COMPRISING A HYPERFREQUENCY COMPONENT AND A PRINTED CIRCUIT

BACKGROUND OF THE INVENTION

Field of the Invention

The present invention relates to an assembly comprising a hyperfrequency component and a printed circuit.

Description of the Related Art

An electronic component is said to be "hyperfrequency" when it is able to operate in the hyperfrequency range, i.e., at frequencies comprised between 1 GHz and several tens of GHz, for example approximately 60 GHz.

Electronic components of the SMC (surface-mounted component) type are soldered to the surface of an electronic board, instead of including pins that pass through the electronic board. SMC components have metal terminals or pins at their ends to be able to be soldered directly to the surface of the printed circuits.

When a hyperfrequency signal propagates from the hyperfrequency line of a printed circuit toward the input, generally coaxial, of an enclosure of an SMC component, a significant mismatch between the two different types of transmission lines causes strong disruptions, in particular by creating inductances or parasitic capacitances. This mismatch is generally accompanied by losses or hyperfrequency reflections, which limits the maximum usage frequency of the component. Furthermore, incorrect management of the propagation of the signal between the printed circuit and the component, as well as between the adjacent inputs of the component, causes an insulation fault between those inputs, which causes coupling of the inputs and limits the maximum frequency of the component.

A relay of the SMC type including several channels at the base of the component is known from a technical brochure by the company TELEDYNE dated 2007 and bearing reference SGRF100/SGRF103. Insulating walls are positioned between the channels. The pin that terminates the central conductive rod of each channel is curved to be soldered on a printed circuit board, and protrudes outside an enclosure of the relay. A bead of glass keeps the rod in the housing of the relay at the bushing of the enclosure. The bead of glass does not make it possible to optimize the signal at high frequencies because it creates a mismatch of the line and generates losses, limiting the frequency rise. Furthermore, the section of the central conductive rod is constant and non-configurable, which limits the optimization of the hyperfrequency adaptation in that zone. No precaution is recommended to prevent the coupling of the channels at the printed circuit. There are therefore hyperfrequency signal leaks through the printed circuit. The insulation between the channels is therefore imperfect. The transmission of the signal between the printed circuit and the active part of the relay is not optimized, which limits the frequency increase.

BRIEF SUMMARY OF THE INVENTION

The invention more particularly aims to resolve these drawbacks by proposing an assembly comprising a hyperfrequency component of the SMC type and a printed circuit board, with an improved transition between the printed circuit board and the component. The invention also aims to propose an improved insulation between hyperfrequency channels, so as to reliabilize the operation of the component at high frequencies.

To that end, the invention relates to an assembly comprising a hyperfrequency component of the surface-mounted component type including at least one first hyperfrequency transmission line, as well as a printed circuit board including at least one second hyperfrequency transmission line able to be put in contact with the first hyperfrequency transmission line. The component comprises an enclosure with a face in contact with the printed circuit board, which includes at least one cavity for confining a hyperfrequency signal, delimited by at least one conductive surface of the enclosure, and by a conductive zone connected to the exposed conductive part of the second hyperfrequency transmission line of the printed circuit, the conductive zone at least partially enclosing a recess of the enclosure delimited by the conductive surface to form the cavity.

Owing to the invention, the hyperfrequency signal is guided in the cavity arranged below the enclosure of the component. Thus, the losses and leaks of the signal caused by the passage of the signal between the board and the component are reduced.

Furthermore, the cavity is formed by the assembly of the enclosure, delimiting the recess, and the board supporting the conductive zone. The assembly is therefore easier to produce.

According to advantageous but optional aspects of the invention, such an assembly may incorporate one or more of the following technical features, considered in any technically allowable combination:

The enclosure is made from a conductive material and the conductive surfaces of the recess are made from metal.

The first hyperfrequency transmission line comprises a conductive line maintained in the enclosure by an insulating part.

The insulating part is overmolded around the conductive line.

The insulating part is overmolded inside the enclosure.

The insulating part is fastened in the enclosure using a resin mass.

The enclosure is made from an insulating material and the conductive surfaces of the recess are metallized, for example through a nickel deposition.

The enclosure includes a first hole, which emerges in the cavity and which includes a conductive side surface that is part of the first hyperfrequency transmission line, and metallized vias are arranged in the enclosure along a closed contour surrounding the first hole.

The first hyperfrequency transmission line is formed both by the conductive surfaces of the cavity and by an attached conductive line.

The first hyperfrequency transmission line is formed only by the conductive surfaces of the cavity.

The component is able to operate at frequencies exceeding 1 GHz.

The component and/or the board is an interconnected molded device.

The component is a hyperfrequency relay.

BRIEF DESCRIPTION OF THE DRAWINGS

The invention will be better understood, and other advantages thereof will appear more clearly, in light of the following description of three embodiments of an assembly comprising an SMC hyperfrequency component as well as a printed circuit board, according to the invention, done in reference to the appended drawings, in which.

DETAILED DESCRIPTION OF THE PREFERRED EMBODIMENTS

Figure 1:
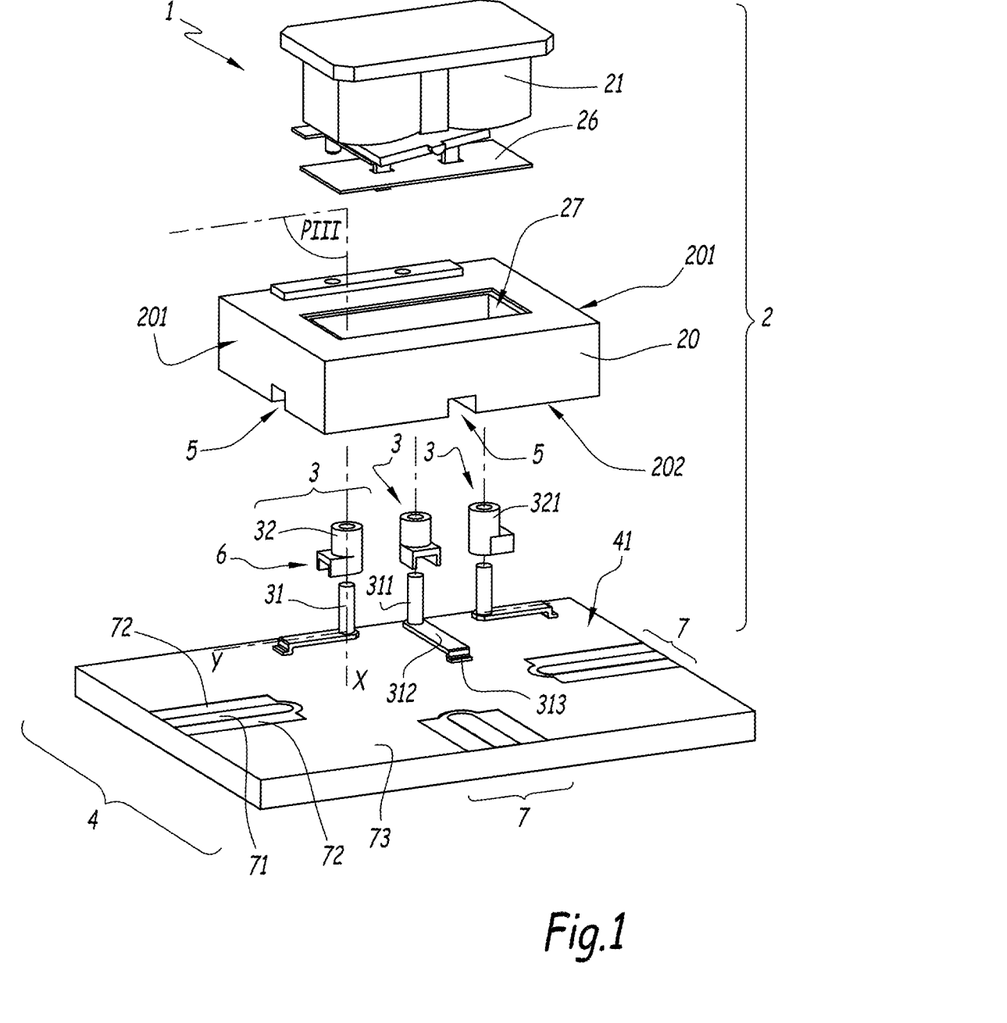
FIG. 1 is an exploded perspective view of an assembly according to a first embodiment of the invention, comprising a hyperfrequency component mounted on a printed circuit board.
Figure 2:
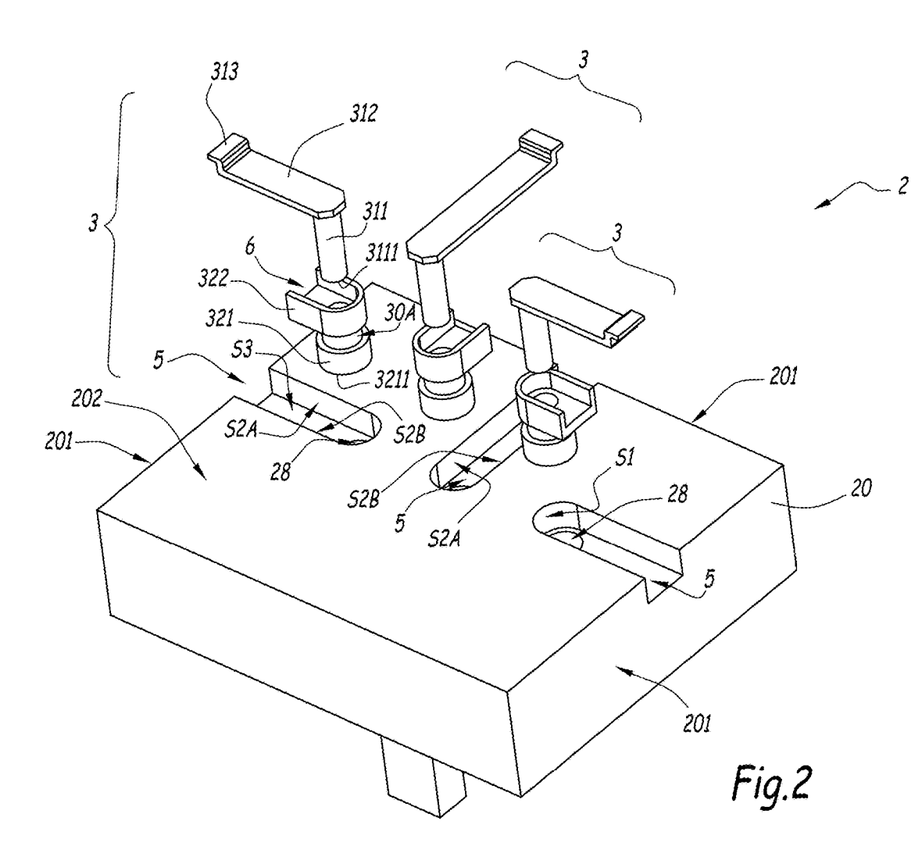
FIG. 2 is a partial exploded perspective view, from below, of the component shown in FIG. 1.
Figure 3:
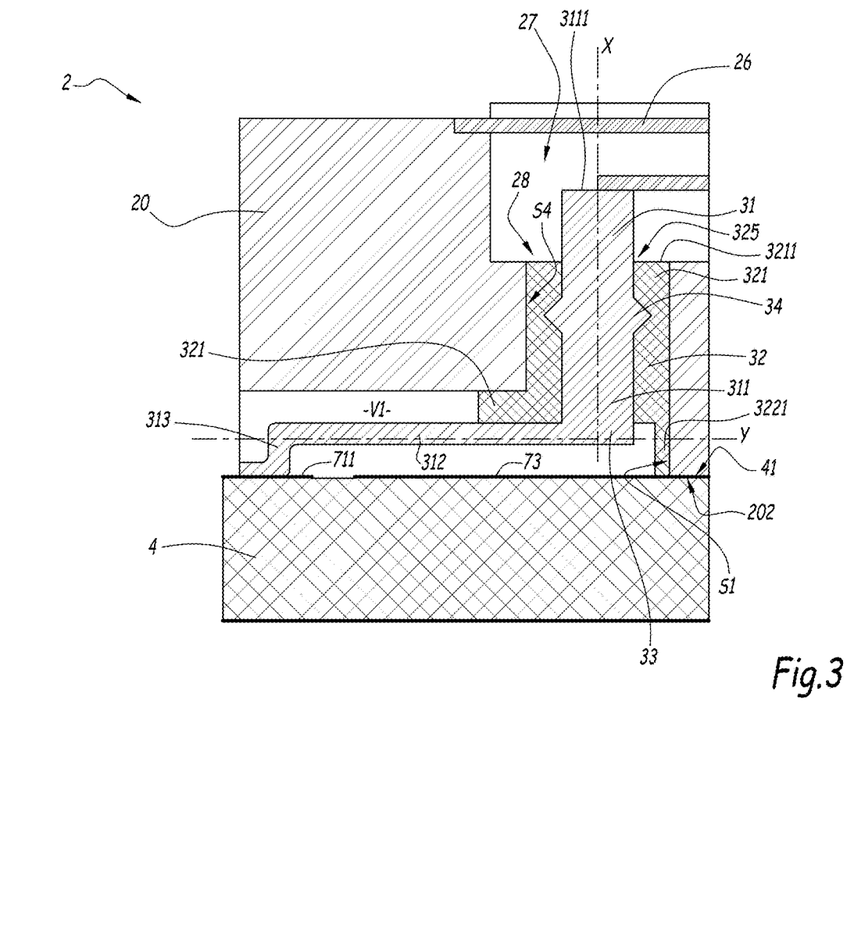
FIG. 3 is an enlarged detailed sectional view along plane PIII in FIG. 1.

FIGS. 1 to 3 show an assembly 1 comprising a hyperfrequency component 2 and a printed circuit board 4. In the illustrated example, the component 2 is a miniature relay, more specifically an SPDT (Single Pole Double Throw) relay, the dimensions of which are approximately a $cm^3$. This is a surface-mounted component (SMC). Alternatively, it may be any other component requiring insulation between its coaxial channels, for example other types of relays such as a DPDT (Double Pole Double Throw) relay or more generally a nPnT (n Poles, n Throw) relay, a coupler, a divider, a filter or a multiplexer.

The relay 2 is a hyperfrequency component, i.e., it is capable of operating in a hyperfrequency range, i.e., at a minimum frequency of 1 GHz and beyond.

Alternatively, the invention applies to hyperfrequency power applications.

Hereinafter, the terms "top", "bottom", "vertical", "horizontal", "upper" and "lower" are defined in relation to the orientation of the assembly 1 in FIG. 1 where the board 4 is situated at the bottom relative to the component 2, which is situated at the top. In this figure, the board 4 is oriented horizontally. In practice, the orientation of the assembly 1 may be different during its use.

The component 2 comprises an enclosure or body 20 made from a conductive material. For example, the enclosure 20 is manufactured by machining or molding a block of a metal alloy such as brass. Alternatively, it may be made from a metallized plastic material.

The enclosure 20 preferably has a parallelepiped shape and includes a horizontal lower face 202 provided to come into surface contact with the upper face 41 of the board 4. Other forms are possible for the enclosure 20.

In the illustrated example, the relay 2 comprises an electromagnetic switching element 21.

The component 2 includes at least one hyperfrequency transmission line 3 called "transition" for conveying a hyperfrequency signal. Preferably, the component includes several transitions 3. Each transition 3 comprises a conductive line 31 called "contact" able to come into contact with an active part of a hyperfrequency channel of the component 2, for example one of the mobile contacts of the relay 2.

The functional part of the component 2 is housed in a recess 27 of the enclosure 20, optionally closed on top by a cover 26.

The contact 31 has a bent shape and comprises a first vertical portion or rod 311, ending with an upper end 3111, as well as a second horizontal portion or blade 312 connected to the rod 311, opposite the upper end 3111 and the free end of which ends with a tab 313. The rod 311 is inserted through a through hole 28 called "bushing", arranged in the enclosure 20.

The rod 311 may have a cylindrical shape with a circular section, and extends along a first geometric axis X. The blade 312 is flat and its free end or front end, i.e., the end opposite the rod 311, is curved downwardly so as to form the contact tab 313 for the connection with the board 4. The blade 312 extends along a second geometric axis Y, perpendicular to the axis X. The contact 31 is for example manufactured by cutting and folding a strip of a copper alloy.

The terms "front" and "rear" are defined in reference to the orientation of the axis Y, considering that the rear of the blade 312 is situated near the rod 311, opposite the front, which is further therefrom.

The contact 31 is supported by an insulating part, called insulator 32, with a bent shape, which comprises a first vertical portion or ring 321 globally in the shape of a hollow cylinder with a circular section, extending along the axis X. The ring 321 is at least partially housed in the hole 28 of the enclosure 20 and includes a central bore 325 centered on the axis X, in which the rod 311 of the contact 31 is partially housed. Opposite the upper end 3211 of the ring 321, the ring 321 is extended by a second portion or collar 322 perpendicular to the ring 321, extending along the axis Y. The collar 322 allows the guiding and mechanical maintenance of the contact 31. The collar 322 of the insulator 32 includes a bottom wall or rear wall 3221, two side walls 323A and 323B and an upper wall 324, delimiting a housing 6 open toward the bottom and the front, extending along the axis Y. As an example, the rear wall 3221 is in the form of a cylinder with a circular section, the longitudinal axis of which is combined with the axis X. Alternatively, the rear wall 3221 of the insulator 32 may have a different shape, for example a square-type shape. The side walls 323A and 323B extend the rear wall 3221 and are parallel to the axes X and Y. The upper wall 324 is perpendicular to the walls 3221, 323A and 323B, perpendicular to the axis X and parallel to the axis Y.

The collar 322 is housed in a recess 5 in the form of a slot extending along the axis Y and simultaneously emerging on the front, on one of the side faces of the enclosure 20, and downward, on the lower face 202 of the enclosure 20. The recess 5 is downwardly closed by the upper face 41 of the printed circuit board 4, so as to define a cavity C closed on the sides and the top. A first longitudinal end of the recess 5 emerges on one of the side faces of the enclosure 20, and a second opposite longitudinal end emerges on the hole 28 for passage of the insulator 32.

The rod 311 of the contact 31 includes a peripheral harpoon 34 that ensures that it is kept in the ring 321 of the insulator 32. The insulator 32 is for example overmolded around the contact 31 when the contact 31 is already mounted in the enclosure 20.

Alternatively, the insulator 32 is forcibly mounted around a rod 311 of the contact 31, then the assembly formed by the contact 31 and the insulator 32 is mounted in the hole 28 of the enclosure 20.

The recess 5 includes a bottom wall or rear wall S1, for example in the form of a cylinder portion with a circular section for instance, with longitudinal axis X and a diameter substantially equal to that of the rear wall 3221 of the insulator 32, such that the rear wall 3221 is in surface contact with the rear wall S1 of the recess 5. The recess 5 includes two side walls S2A and S2B parallel to the axis Y, which extend the rear wall S1. The side walls S2A and S2B are each connected to one of the side faces of the enclosure 20. The recess 5 also includes an upper wall S3 that connects the side walls S2A and S2B and that can be parallel to the lower face 202 of the enclosure 20.

A junction zone 33 between the first 311 and second 312 portions of the contact 31 is housed in the housing 6 of the insulator 32. The blade 312 of the contact 31 can extend in the cavity C and may protrude from the front of the housing 6.

A hollow volume V1, which is the inner volume of the cavity C, extends between the blade 312 of the contact 31 and the upper walls S3 of the recess 5 on the one hand, and between the blade 312 of the contact 31 and the upper wall 41 of the printed circuit board 4 on the other hand.

Along the axis Y and at the collar 322 of the insulator 32, the volume V1 is filled with the material of the insulator 32. Along the axis Y and between the collar 322 of the insulator 32 and the side wall of the enclosure 20 on which the recess 5 emerges, the volume V1 is filled with air. Alternatively, it may be filled with an electrically insulating material, in the case of overmolding, for example.

The board 4 includes at least one hyperfrequency transmission line, for example three lines 7. Preferably, the board 4 includes several transmission lines. Each line 7 is provided to be electrically connected to one of the transitions 3 of the component 2. These lines 7 may be of the coplanar, microstrip, etc. type.

The tab 313 of the contact 31 comes into mechanical and electric contact with the central and planar conductive track 71 of the hyperfrequency transmission line 7, made on the upper face 41 of the board 4. The free end of the tab 313 is flush with the side face of the enclosure 20, i.e., it does not protrude outside the cavity C, along the axis Y. Alternatively, the tab 313 may protrude outside the cavity C to facilitate the visual examination and in order to be manually soldered, for example. In that case, the chip floorplan is extended and the insulation is improved. On the contrary, the tab 313 may be slightly withdrawn inside the cavity C or recess 5.

The central track 71 extends parallel to the axis Y, in the extension of the blade 312 of the transition 31, and protrudes below the cavity C. More specifically, an end part 711 of the central track 71 may optionally extend past the side wall of the enclosure 20, below the cavity C.

The central track 71 is insulated from the chip floorplan 73 of the board 4 by a U-shaped insulating part 72, which is a zone without conductive metallization, for example made by chemical etching. The dimensions of the elements of the transmission line 7 may be modified, which makes it possible to adapt the propagation of the hyperfrequency waves.

When an electric signal is transmitted by the line 7 near the enclosure 20, the signal passes from the line 7 of the board 4 to the transition 3 of the component 2, by means of the contact between the tabs 313 of the contact 31 and an end part 711 of the central track 71, as well as by means of the contact between the conductive zone 73 of the board 4 and the conductive zone 202 of the component 2.

Owing to the walls S1, S2A, S2B and S3 of the cavity C, which are conductive, the signal remains confined to the inside of the volume V1. On the top, the signal is blocked by the rear wall S1 of the cavity C. From below, the signal is blocked by the conductive zone 73 of the line 7 of the board 4, which at least partially closes the recess 5 from below and which is situated at least partially below the enclosure 20.

The conductive zone 73 or "chip floor plan" is grounded. On the sides, the signal is blocked by the side walls S2A and S2B of the cavity C.

The volume V1 thus forms a cavity C whereof the walls S1, S2A, S2B, S3 and 73 are conductive and grounded.

Along the axis X, the signal propagates between the rod 311 of the contact 31 and the metal wall S4 of the housing 20 delimits the hole 28, in the material of the insulator 32. This wall being conductive, the signal remains confined and leaks toward the other transitions 3 are avoided.

This makes it possible to use the assembly 1 with hyperfrequency signals having a high frequency. FIGS. 4 to 8 show five alternatives of the component 2, for which the elements similar to the corresponding elements of the component of FIGS. 1 to 3 bear the same references. Below, we will not provide a detailed description of the elements of the alternatives that are similar to those of the component 2 of FIGS. 1 to 3.

Figure 4:
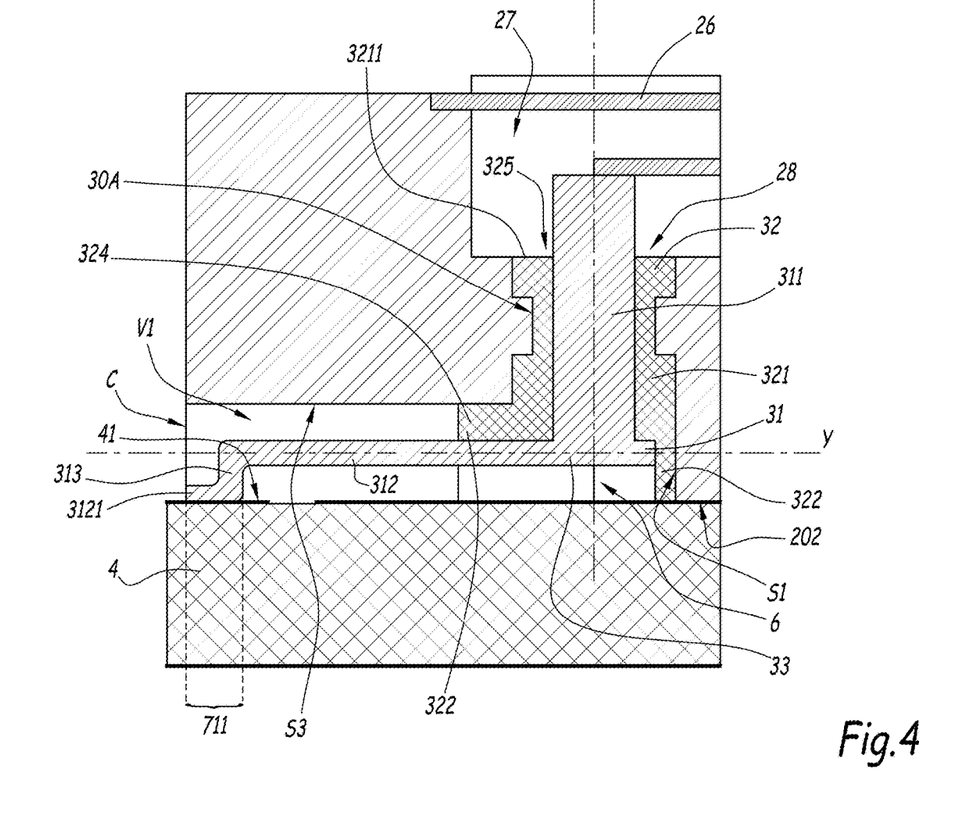
FIGS. 4 to 8 are views similar to FIG. 3 of five alternatives of the first embodiment.

FIG. 4 shows a first alternative of the component 2, in which the ring 321 of the insulator 32 includes an annular peripheral groove 30A filled by a complementary shape of the enclosure 20, which makes it possible to keep the insulator 32 in position in the enclosure. The insulator 32 is then overmolded in the enclosure 20.

Figure 5:
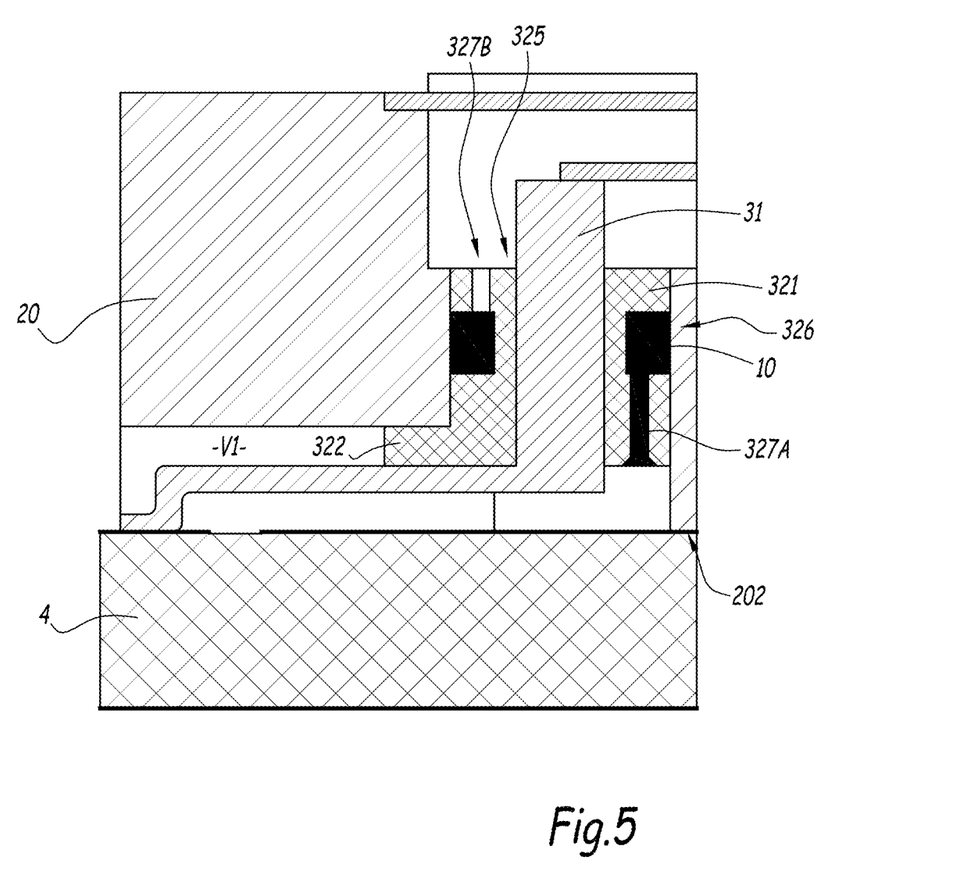

FIG. 5 shows a second alternative of the component 2, in which the ring 321 of the insulator 32 includes an outer peripheral groove 326 provided with at least one injection hole 327A and a vent hole 327B, or vice versa.

During the manufacture of the component 2, the contact 31 is mounted in the hole 325 of the insulator 32. Then, the assembly formed by the contact 31 and the insulator 32 is mounted in the hole 28 of the enclosure 20. To immobilize the insulator 32 relative to the enclosure 20, a resin mass 10 is injected through the injection hole 327A or 327B. The resin 10 fills the peripheral groove 326 and the air escapes through the vent 327B or 327A, respectively.

Figure 6:
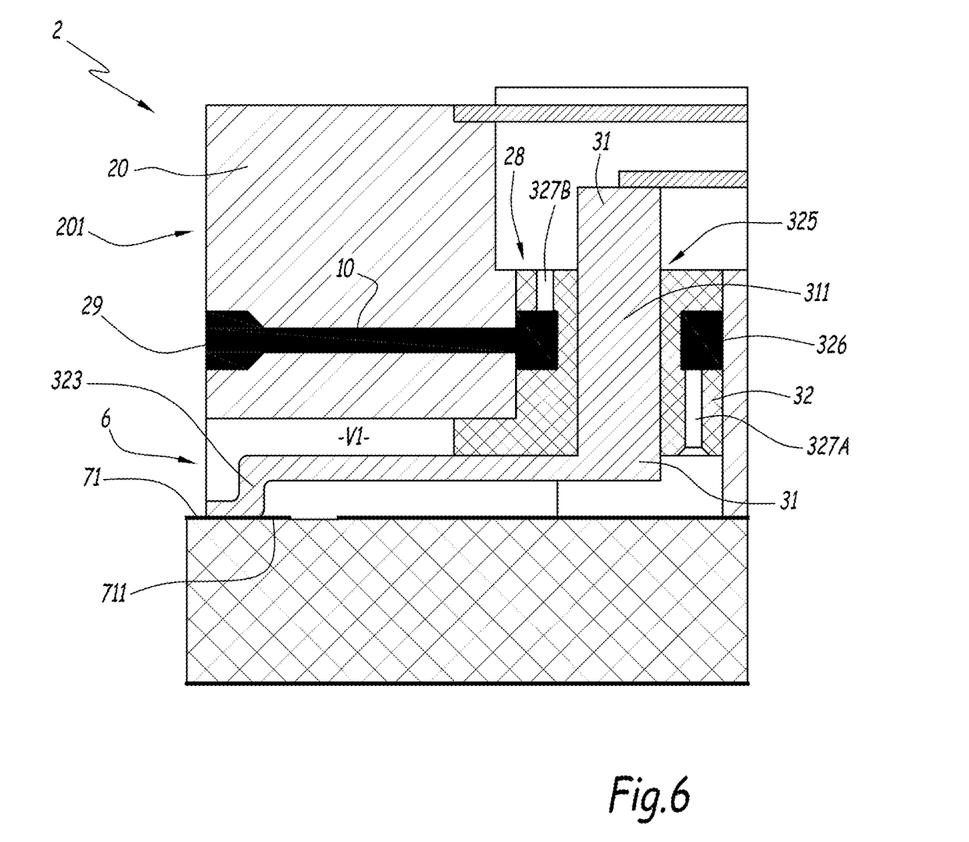

FIG. 6 shows a third alternative that differs from the second alternative in that the enclosure 20 includes a horizontal injection hole 29 that for example connects one of the walls of the enclosure 20 to the hole 28.

Figure 7:
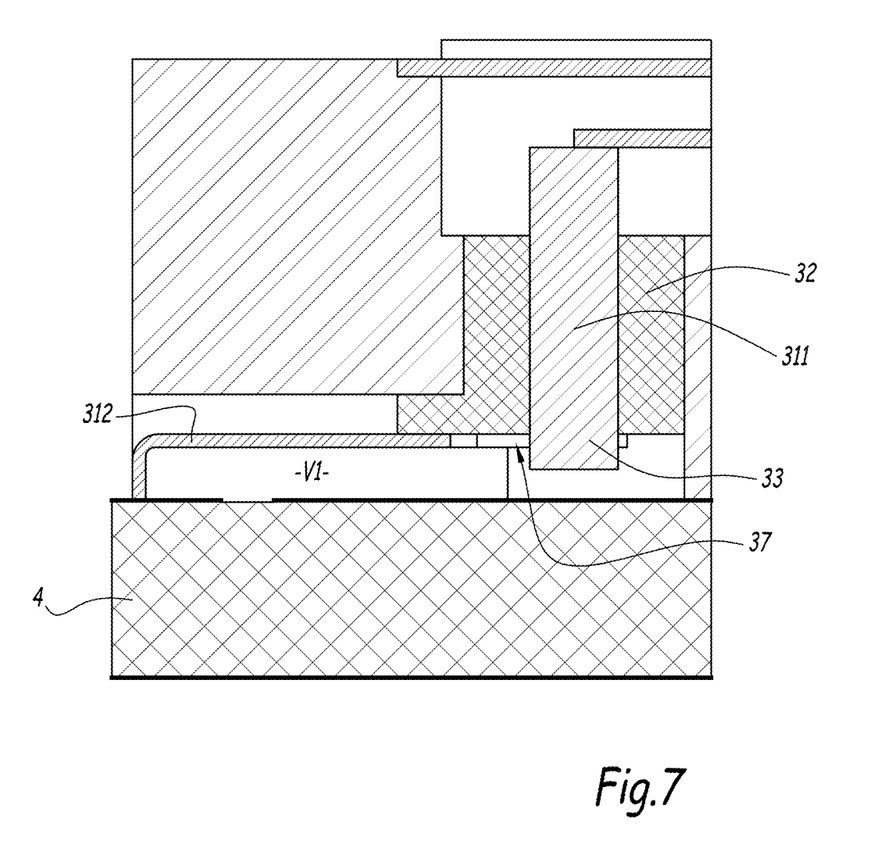

FIG. 7 shows a fourth alternative of the hyperfrequency component 2, in which the contact 31 is formed by two separate parts 311 and 312. The first part 311 constitutes the rod of the contact 31, and the second part 312 constitutes the blade of the transition 31. At the junction zone 33 between the parts 311 and 312, the assembly is done, for example, owing to a notch 37 in which the lower end of the rod 311 becomes housed. It is then easier to manufacture a contact 31 with two parts 311 and 312.

Figure 8:
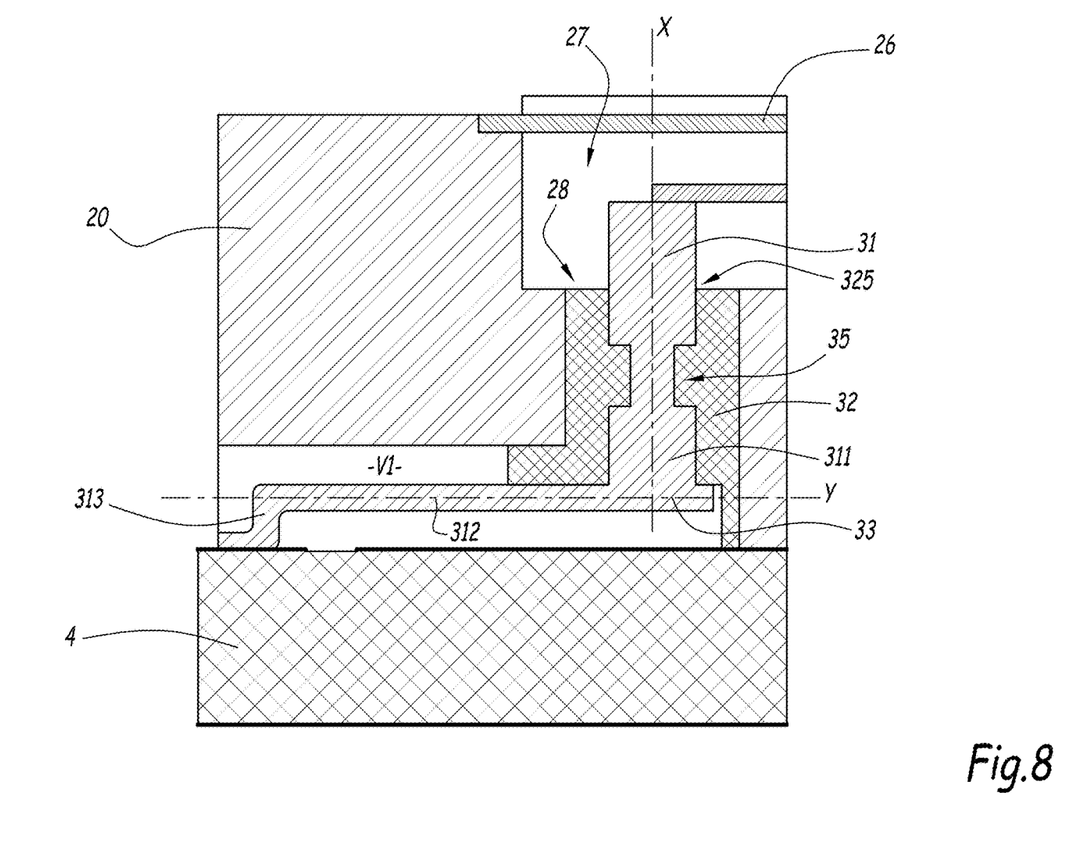
Figure 9:
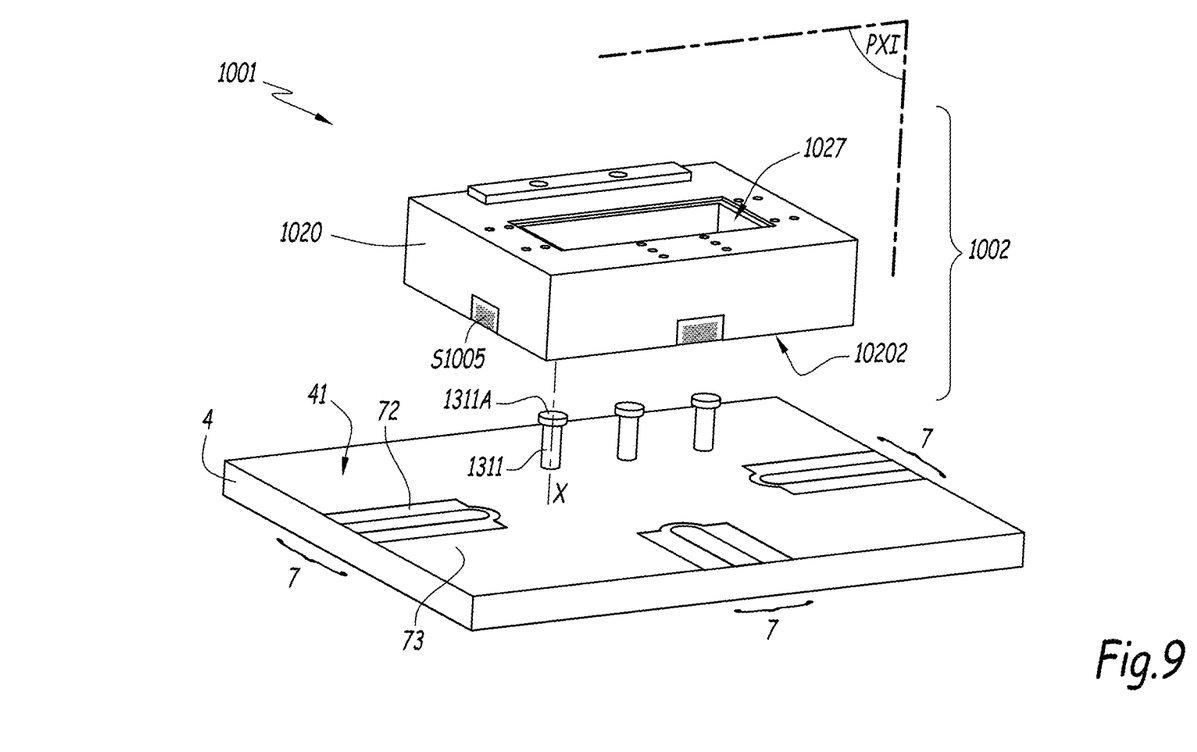
FIG. 9 is an exploded perspective view of an assembly according to a second embodiment of the invention.
Figure 10:
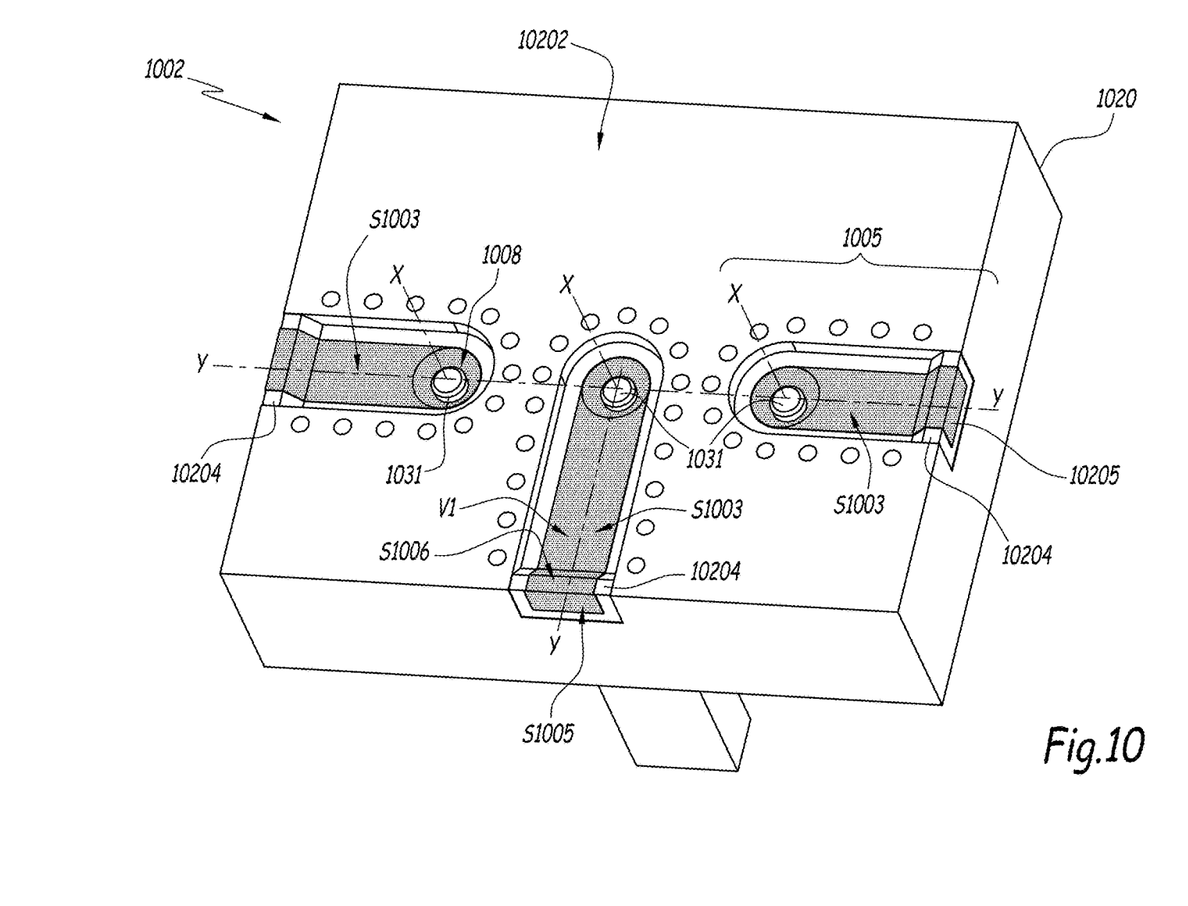
FIG. 10 is a partial bottom perspective view of the assembly of FIG. 9.

FIG. 8 shows a fifth alternative of the component 2, in which the rod 311 of the contact 31 includes an annular peripheral groove 35. During the manufacture of the component 2, the contact 31 is placed in the hole 28 of the enclosure 20. Then, the insulator 32 is overmolded around the contact 31, such that the material of the insulator 32 fills the groove 35. Then, the assembly formed by the contact 31 and the insulator 32 is forcibly mounted in the hole 28 of the enclosure 20, such that the insulator 32 remains kept in position in the enclosure 20.

The alternatives of FIGS. 4 and 8 can be combined for simultaneous overmolding of the insulator 32 around the contact 31 inside the enclosure 20.

FIGS. 9 to 12 show an assembly 1001 according to a second embodiment of the invention.

The assembly 1001 comprises a hyperfrequency component 1002, including three hyperfrequency transmission lines 1003, and a printed circuit board 4 similar to that described in reference to FIGS. 1 to 3. The elements of the component 1002 similar to those of the component 2 of FIGS. 1 to 3 bear the same numerical references, increased by 1000. Below, we do not provide a detailed description of the elements of the component 1002 that are similar to those of the component 2.

The component 1002 comprises an enclosure 1020 made from an insulating material such as a high temperature polymer, for example by injection. The enclosure 1020 comprises at least one hole 1028 for the passage of the conductive rod 1311, which may for example assume the form of a cylindrical rod with a circular section centered on an axis X and the upper end of which is formed by a head 1311A, which may have a larger diameter. The conductive rod 1311 is an attached part. As an example, the upper end of the hole 1028 is bordered by a shaft 1028A that protrudes inside a cavity 1027 of the enclosure 1020. The head 1031A of the conductive rod 1311 bears on the upper end of the shaft 1028A. Opposite the shaft 1028A, the lower end of the hole 1028 is beveled and flares downwardly.

A recess 1005 extending along the axis Y is arranged in a lower face 10202 of the enclosure 1020. The recess 1005 is closed downwardly by a conductive zone 73 connected to the exposed conductive part of the transmission line 7, so as to form a cavity C.

Unlike the recess 5 of the component 2, the cavity 1005 does not emerge at the side face of the enclosure 1020. The enclosure 1020 includes a closing wall 10204 that obstructs the front end of the recess 1005 and that makes it possible to connect the transmission line 7 of the board 4 to the transition 3 of the component 2. Reference S1006 denotes a conductive portion of that wall 10204, in contact with the end 711 of the conductive track 71 of the transmission line 7 of the board 4. Furthermore, the component 1002 does not include an insulator for maintaining the conductive rod 1311, the insulator being shown by the enclosure 1020. The conductive rod 1311 is mounted directly in the hole 1028 and comes into surface contact with a cylindrical wall S1004 of the hole 1028. Furthermore, the conductive rod 1311 does not include a second portion or a contact tab.

For the electrical connection between the transmission line 7 of the board 4 and the transition 1003 of the component 1002, an upper wall S1003 of the recess 1005 is at least partially metallized so as to form a conductive track, for example through a nickel deposition.

Figure 11:
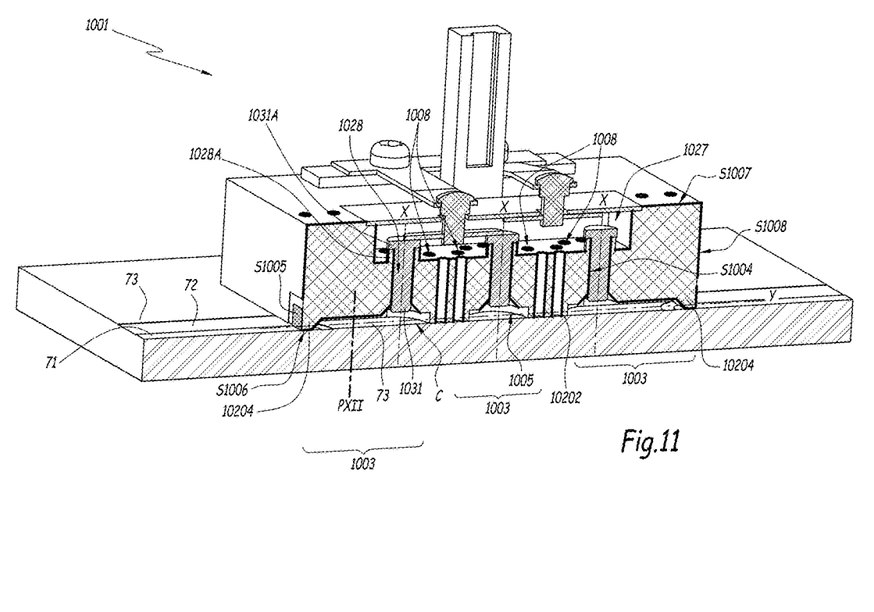
FIG. 11 is a partial view along plane PXI in FIG. 9.
Figure 12:
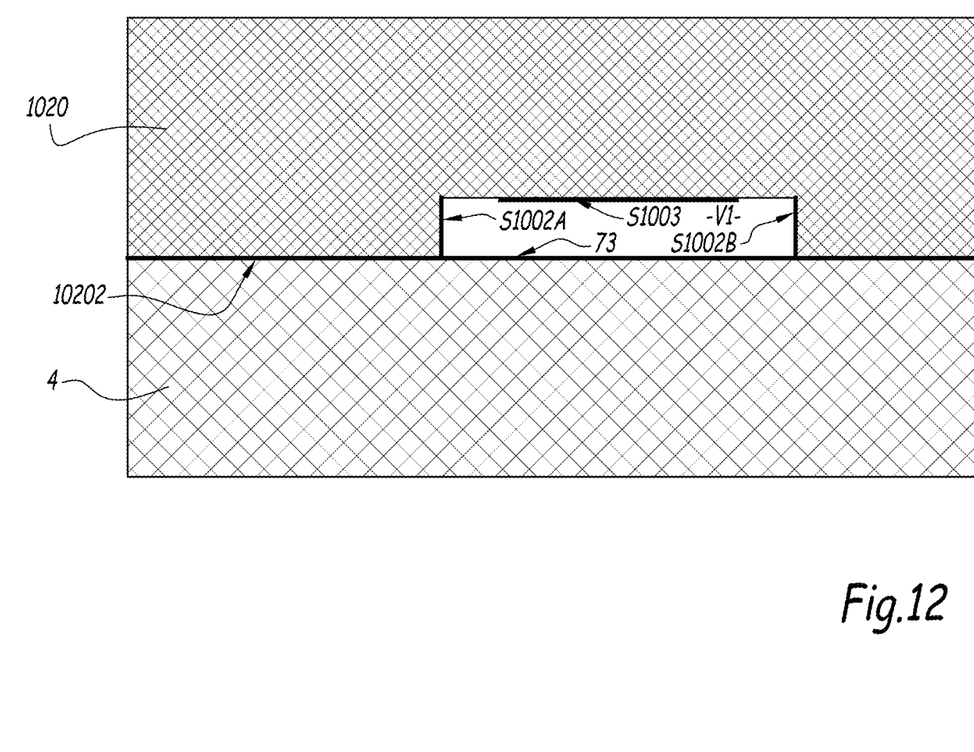
FIG. 12 is a sectional view along plane PXII in FIG. 11.

In FIGS. 11 and 12, for greater clarity, the metallized surfaces are shown in bold lines, the thickness of which is not representative of the actual thickness of the conductive layer.

The wall S1004 of the hole 1028, the portion S1006 of the wall 10204 of the enclosure 1020 in contact with the board 4, and an outer surface S1005 of the side wall, adjacent to the board 4, are also metallized, and form conductive surfaces that embody the transition 1003, which is similar to the transition 3 of the component 2 of FIGS. 1 to 3.

Around the shaft 1028A, the lower wall of the recess 1027 of the housing 1020 is provided with metallized through holes 1008, or "vias", parallel to the axis X and pierced along a closed contour that may be circular and that extends around the hole 1028.

Upper S1007 and side S1008 surfaces and a bottom surface S10202 that are adjacent to the enclosure 1020 are also metallized, and come into contact (directly, or indirectly in the case of S1007) with the chip floorplan 73 of the board 4.

The hyperfrequency signal is conveyed by the transmission line 7 of the board 4, near the enclosure 1020, and goes from the transmission line 7 of the board 4 to the transition 1003 of the component 1002, by means of metallized surfaces S10202, S1007 and S1008 for grounding of the transmission line, and by means of the surfaces S1005 and S1006 of the housing 1020 for the conductive part of the transmission line.

The signal next propagates, via the transition 1003, in the cavity C, which is insulated from the chip floorplan 73 by the volume V1. The signal is guided in the shielded cavity C by the chip floorplan 73 of the board 4 and by the conductive side surfaces S1002A and S1002B of the recess 1005, as well as by the surfaces S1007 and S1008 of the enclosure 1020.

Along the axis X, the signal propagates around the metallized hole 1028 surrounded by the vias 1008, which provide a shielding limiting, or even preventing, signal leaks between the transitions 1003. The hole 1028 thus continuously delimits the conductive passage part of the signal, while the vias 1008 discontinuously delimit the outside or the exposed conductive part of the hyperfrequency transmission line.

Figure 13:
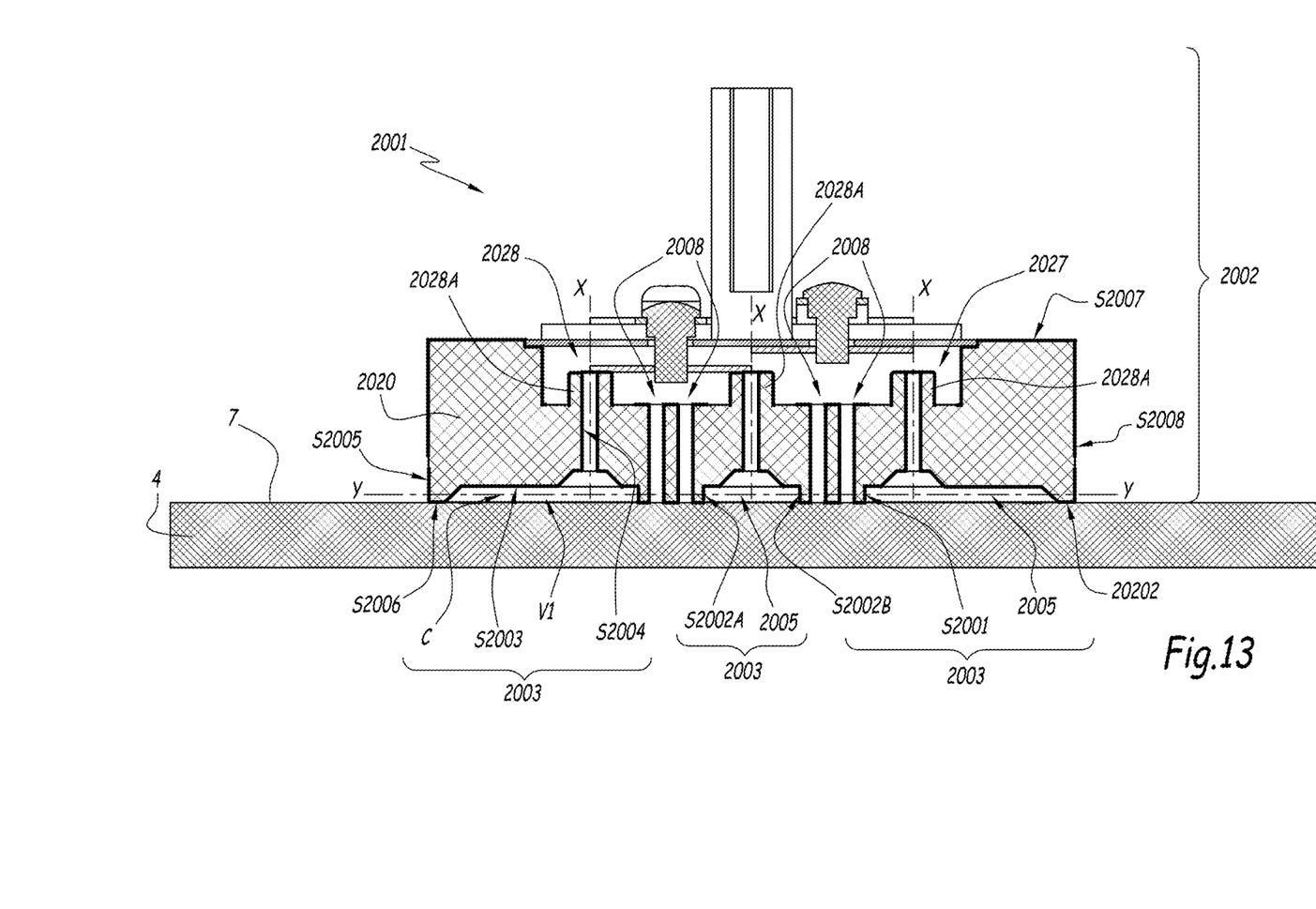
FIG. 13 is a sectional view of an assembly according to a third embodiment of the invention.

FIG. 13 shows an assembly 2001 comprising a hyperfrequency component 2002 according to a third embodiment of the invention, as well as a printed circuit board 4, similar to that of FIGS. 1 to 3. The elements of the component 2002 similar to those of the component 2 of FIGS. 9 to 12 bear the same numerical references, increased by 1000. Below, we do not provide a detailed description of the elements of the component 2002 that are similar to those of the component 1002.

Unlike the component 1002, the component 2002 does not include an attached conductive rod. Recesses 2005 of a housing 2020 do not emerge on side faces of the enclosure 2020.

The housing 2020 of the component 2002 is made from an insulating material and surfaces S2001, S2002A, S2002B, S2003, S2004, S2005 and S2006 of the recesses 2005 are metallized, as well as the upper S2007 and side S2008 surfaces of the enclosure 2020. A hole 2028, the upper end of which is extended by a shaft 2028A, connects a recess 2027 of the enclosure 2020 to the cavity 2005. The upper surface of the shafts 2028A is metallized, so as to produce an electric contact with the active parts of the component 2002. Each hole 2028 is surrounded by metallized holes or "vias" 2008 parallel to the axis X and pierced along a contour that may be circular.

The recesses 2005 are closed downwardly by a grounded conductive zone 73 of the line 7, so as to form cavities C. The cavities C delimit a volume V1 filled with an insulator, preferably air, surrounded by the conductive surfaces S2001, S2002A, S2002B, S2003, S2004 and 73.

The operation of the assembly 2001 is similar to the operation described in reference to the assembly 1001. Inside the cavity C, i.e., inside the component 2002, the signal propagates via the transition 2003, which is insulated from the chip floorplan 73 by the volume V1. The signal is guided in the shielded cavity C by the chip floorplan 73 and the conductive surfaces S2001, S2002A, S2002B, and also by the metallized surfaces S2007 and S2008 that are grounded. Along the axis X, the signal propagates via the coaxial line formed by the wall of the hole S2004 and the grounded and metallized vias 2008 surrounding the hole S2004, which limits or prevents signal leaks between the transitions 2003A, 2003B and 2003C.

Alternatively, the assemblies 1001 and 2001 of FIGS. 9 to 13 may be produced from the MID (Molded Interconnect Devices) technology, in particular, and/or the component 1002 or 2002, which are then called "interconnected molded devices".

In the context of the invention, the various described embodiments and alternatives may be combined, at least partially. Furthermore, the optimization of the hyperfrequency performance may lead to slightly modifying the geometry of the components (insulators, contacts, enclosures, tracks) without modifying the principle of the invention. For example, the cavity C may be delimited by at least one conductive surface of the enclosure, which may have a curved shape.

The invention claimed is:

1. An assembly comprising:
   a surface-mounted hyperfrequency component including at least two first hyperfrequency transmission lines;
   a printed circuit board including at least two second hyperfrequency transmission lines, each second hyperfrequency transmission line being connected to a corresponding first hyperfrequency transmission line,
   the surface-mounted hyperfrequency component comprising an enclosure having a face in contact with the printed circuit board; and
   for each first hyperfrequency transmission line, one cavity configured to confine a hyperfrequency signal, each cavity being delimited by:
   at least one conductive surface of the enclosure, and
   a grounded conductive zone on a surface of the printed circuit board, at least partially closing a recess of the enclosure delimited by the conductive surface to form the cavity, the grounded conductive zone being at least a portion of a bottom surface of the cavity when the hyperfrequency component and the printed circuit board are aligned along a vertical direction, the hyperfrequency component being above the printed circuit board.

2. The assembly according to claim 1, wherein the enclosure is made from a conductive material, and the conductive surfaces of the recess are made from metal.

3. The assembly according to claim 2, wherein each first hyperfrequency transmission line comprises a conductive line maintained in the enclosure by an insulating part.

4. The assembly according to claim 3, wherein the insulating part is overmolded around the conductive line.

5. The assembly according to claim 3, wherein the insulating part is overmolded inside the enclosure.

6. The assembly according claim 3, wherein the insulating part is fastened in the enclosure using a resin mass.

7. The assembly according to claim 1, wherein the enclosure is made from an insulating material, and
   the conductive surfaces of each recess are metallized.

8. The assembly of claim 7, wherein the conductive surfaces of the recess are metallized by nickel deposition.

9. The assembly according to claim 7, wherein the enclosure includes a first hole that emerges in the cavity, the first hole including a conductive side surface that is part of the first hyperfrequency transmission line, and
   metallized vias are disposed in the enclosure along a closed contour surrounding the first hole.

10. The assembly according to claim 7, wherein each first hyperfrequency transmission line is formed by the conductive surfaces of the corresponding cavity and an attached conductive line.

11. The assembly according to claim 7, wherein each first hyperfrequency transmission line is formed only by the conductive surfaces of the corresponding cavity.

12. The assembly according to claim 1, wherein the surface-mounted hyperfrequency component is configured to operate at frequencies exceeding 1 GHz.

13. The assembly according to claim 1, wherein the surface-mounted hyperfrequency component or the board is an interconnected molded device.

14. The assembly according to claim 1, wherein the surface-mounted hyperfrequency component is a hyperfrequency relay.

* * * * *